United States Patent [19]
Yamashina et al.

[11] Patent Number: 5,847,022
[45] Date of Patent: Dec. 8, 1998

[54] RADIATION CURABLE RESIN COMPOSITION AND METHOD THEREFOR

[75] Inventors: Yozo Yamashina; Eiju Ichinose; Yoichi Abe; Hidenobu Ishikawa, all of Ichihara, Japan

[73] Assignee: Dainippon Ink and Chemicals, Inc., Tokyo, Japan

[21] Appl. No.: 620,039

[22] Filed: Mar. 21, 1996

[30] Foreign Application Priority Data

Mar. 27, 1995 [JP] Japan ..................................... 7-067224
Oct. 31, 1995 [JP] Japan ..................................... 7-283244

[51] Int. Cl.$^6$ ............................. C08F 2/50; C08F 265/02
[52] U.S. Cl. ......................... 522/149; 522/151; 522/152; 526/273; 526/310; 526/311; 526/328.5; 526/329.2; 526/328; 528/421; 523/160
[58] Field of Search ...................... 522/151, 152, 522/149, 129, 173; 526/273, 310, 311, 328.5, 329.2, 328; 528/421

[56] References Cited

U.S. PATENT DOCUMENTS

| | | | |
|---|---|---|---|
| 4,808,510 | 2/1989 | Snow et al. ............... | 522/149 |
| 5,002,977 | 3/1991 | Seko et al. ................ | 522/149 |
| 5,093,223 | 3/1992 | Iwasawa et al. .......... | 430/280 |
| 5,334,485 | 8/1994 | Van Iseghem et al. ................ | 522/151 |

FOREIGN PATENT DOCUMENTS

| | | |
|---|---|---|
| 0 573 053 A1 | 12/1993 | European Pat. Off. . |
| 3841 422 A1 | 6/1989 | Germany . |
| 2 061 273 | 5/1981 | United Kingdom . |

*Primary Examiner*—Susan W. Berman
*Attorney, Agent, or Firm*—Armstrong, Westerman, Hattori, McLeland & Naughton

[57] ABSTRACT

The present invention provides a radiation curable resin composition and method of production therefor; the present composition has wide applications as an ink, coating or the like, is dilutable in water or an organic solvent, and forms a coating which has excellent hardening characteristics and adherence to a substrate, as well as superior resistance to heat, chemicals and boiling, this resin composition may be redissolved with water or an organic solvent prior to hardening; which have a number average weight of 500 to 50,000, characterized in that the aprotic ammonium salt represented by general formula 1 is contained in the resin in the amount of 0.1 to 4.0 mol/kg.

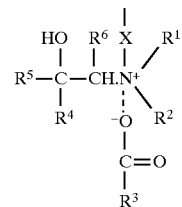

(In the formula, X is an organic group which is bound to the main chain and includes a hydrocarbon of 0 to 3 carbon atoms, an ester and an amide; R1 and R2, which may be the same or different, represent a hydrocarbon of 1 to 8 carbons which may be substituted with a hydroxyl group, ester group, alkoxy group or halogen atom, wherein R1 and R2 may bond together, with bonding occurring between the nitrogen atoms of R1 and R2 to form a heterocyclic ring; R3 indicates a hydrogen atom or a hydrocarbon of 1 to 18 carbon atoms that has one or more polymerizable unsaturated double bonds and may be substituted with a hydroxyl group, ester group, alkoxy group, or halogen atom; and R4, R5 and R6, which may be the same or different, represent a hydrogen atom or a hydrocarbon of 1 to 18 carbons which may be substituted with a hydroxyl group, ester group, alkoxy group, or halogen atom, wherein R5 and R6 may bond together to form a heterocyclic ring.)

9 Claims, No Drawings

RADIATION CURABLE RESIN COMPOSITION AND METHOD THEREFOR

BACKGROUND OF THE INVENTION

1. Field of the Invention

The present invention relates to a water soluble radiation curable resin composition and to a method of production therefor. The resin composition of the present invention can be diluted or removed with water or an organic solvent prior to hardening, while an unhardened coating of the resin can be redissolved with water or an organic solvent. Upon hardening, this resin, which has wide applications as an ink, coating or the like, forms a coating which has excellent adherence to a substrate as well as superior thermal and chemical resistance properties.

2. Description of the Related Art

Examples of hardenable resins, and in particular resins that harden through a radical polymerization reaction, include unsaturated polyester resins, vinyl ester resins, all types of oligoacrylates, diallyl phthalate prepolymers, and the like. These are widely used in various fields of application according to their specific characteristics. However, as concerns about environmental pollution along with the desire to improve work environments have mounted in recent years, demand has grown for a resin which can be hardened with light and is soluble in a non-organic solvent.

Accordingly, such a light hardening, water borne resin is disclosed in Japanese Patent Application, First Application Hei 1-279251, for example. This resin is obtained by reacting acrylic acid with glycidyl groups in a resin obtained by copolymerizing glycidyl methacrylate and N,N-dimethylamino ethyl methacrylate with other polymerizable monomers, and then neutralizing with formic acid. However, crosslinking occurs readily during the synthesis of this resin composition, thus it is extremely difficult to produce and its hardening and thermal resistance properties are poor.

A water soluble resin composition is also disclosed in Japanese Patent Application, First Application Hei 2-1858 wherein an aromatic epoxy resin is reacted with acrylic acid, followed by the addition of a tertiary amine and monocarboxylic acid. However, this resin composition is also difficult to produce, and is problematic with respect to its light hardening properties.

Further, Japanese Patent Application, First Application Hei 7-49467 discloses a water soluble resin composition that forms crosslinks under irradiation which is obtained by using acetic acid to form a quaternary ammonium from a copolymer having a tertiary amino group, and reacting this with a compound having one or more polymerizable unsaturated bonds and one or more epoxy groups.

However, the resin composition obtained using the method disclosed in this document and the resin compositions disclosed in the examples therein have a low concentration of polymerizable double bonds. Further, the polymerizable double bonds introduced are limited to methacrylate, thus, the hardening density and hardening speed are low. Moreover, when attempting to obtain a sufficient concentration of double bonds, the concentration of hydrophilic groups in the resin inevitably becomes too high, so that, after hardening, sufficient water resistance cannot be obtained.

Moreover, known methods for introducing a polymerizble double bond into a resin having an alcoholic hydroxyl group include a condensation reaction between compounds having polymerizable unsaturated double bonds and a carboxyl group, and a reaction between compounds having polymerizable unsaturated double bonds and an isocyanate group. However, in the reaction between alcoholic hydroxyl groups and epoxy compounds having polymerizable unsaturated double bonds, the reaction must be carried out under considerably high temperatures with a specific catalyst. Further, alcoholic hydroxyl groups react with hydroxyl groups generated in the reaction of glycidyl groups. As a result, because the resin having the alcoholic hydroxyl groups hardens, the introduction of functional groups, which employed the reaction between the glycidyl group and the alcoholic hydroxyl group, is extremely difficult.

In order to introduce a new functional group into a resin which has alcoholic hydroxyl groups, a condensation reaction between polymerizable unsaturated double bonds and carboxyl groups, and a reaction between compounds having a polymerizable unsaturated double bonds and isocyanate groups are available. However, synthesis is problematic in that the reaction temperature in the esterification reaction is high, while in the case of the urethanification reaction, the monoisocyanate compound having polymerizable unsaturated double bonds is extremely unstable or has low purity.

SUMMARY OF THE INVENTION

Accordingly, it is the object of the present invention to provide a water soluble radiation curable resin composition and a method of production therefor, which has wide applications as an ink, coating, or the like, the resin being dilutable in water or an organic solvent, and capable of forming a coating which has excellent adherence to a substrate and superior thermal and chemical resistant properties, the unhardened coating capable of which may be redissolved with water or an organic solvent.

In other words, it is the present invention's objective to provide a radiation curable resin composition and a method of production therefor, wherein the resin can be diluted with water or an organic solvent, and an unhardened coating thereof can be redissolved in water or an organic solvent. This resin composition has an excellent hardening reaction under an energy such as light or the like, and can also be hardened by heat. The hardened matter has excellent properties of resistance to alkalis, heat, chemicals, moisture, water, and boiling, while also having excellent adherence to a substrate and superior surface hardness.

The present inventors discovered that by forming a quaternary ammonium from a copolymer (A) having an amino group using a monocarboxylic acid (B) which has one or more polymerizable unsaturated double bonds, the concentration of the reactable double bonds in the resin is not only increased, but also the reactable double bonds are introduced into a position which facilitates the light hardening reaction. As a result, the concentration of a quaternary ammonium salt, which is the hydrophilic group, is not increased unnecessarily. Further, the present inventors also discovered that when an alcoholic hydroxyl group is present in amino resin (A) when forming the quaternary ammonium salt, this alcoholic hydroxyl group reacts with a monoepoxy compound (C) which has a reactable double bond, to further increase the concentration of reactable double bonds in the resin. Thus, in this way, the present invention's radiation curable resin composition and method of production therefor were completed.

In other words, the present invention is a radiation curable resin composition having a number average molecular weight of from 500 to 50,000, and is characterized in the inclusion of aprotic ammonium salt groups indicated by the following general formula 1 in the amount of 0.1 to 4.0 mol/kg.

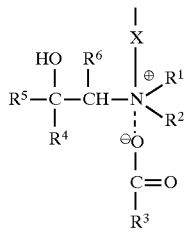

(In the formula, X is an organic group which is bound to the main chain and includes a hydrocarbon of 0 to 3 carbon atoms, an ester and an amide. R1 and R2, which may be the same or different, represent a hydrocarbon of 1 to 8 carbons which may be substituted with a hydroxyl group, ester group, alkoxy group or halogen atom. Further, R1 and R2 may bond together, with bonding occurring between the nitrogen atoms of R1 and R2 to form a heterocyclic ring. R3 indicates a hydrogen atom or a hydrocarbon of 1 to 18 carbon atoms that has one or more polymerizable unsaturated double bonds and may be substituted with a hydroxyl group, ester group, alkoxy group, or halogen atom. R4, R5 and R6, which may be the same or different, represent a hydrogen atom or a hydrocarbon of 1 to 18 carbons which may be substituted with a hydroxyl group, ester group, alkoxy group, or halogen atom. Further, R5 and R6 may bond together to form a heterocyclic ring.)

The present invention is a radiation curable resin composition characterized in that it is obtained by using a monocarboxylic acid (B) having polymerizable unsaturated double bonds to form a quaternary ammonium from a copolymer (A) which has an amino group, and then reacting an epoxy compound (C) with this quaternary ammonium, the radiation curable resin composition of the present invention containing the aprotic ammonium salt shown by general formal 1 in the amount of 0.1 to 4.0 mol/Kg.

More particularly, the radiation curable resin composition of the present invention is characterized in that copolymer (A) having an amino group is a polymer of compound (D) which has polymerizable unsaturated double bonds and a tertiary amino group, and/or is a copolymer of a compound (D) which has a tertiary amino group and a compound (E) which has polymerizable unsaturated double bonds which can be copolymerized with (D).

Still more particularly, the radiation curable resin composition of the present invention is characterized in that copolymer (A) which has an amino group is a copolymer of compound (D), which has polymerizable unsaturated double bonds and a tertiary amino group, and a compound (F), which has an alcoholic hydroxyl group and polymerizable unsaturated double bonds that are copolymerizable with compound (D); and/or is a copolymer of compound (D) and a compound (E), which has polymerizable unsaturated double bonds that can be copolymerized with compound (F).

The radiation curable resin composition of the present invention is characterized in that a monoepoxy compound (C), which is employed as a structural component, is a monoepoxy compound which does not have polymerizable unsaturated double bonds and/or is a monoepoxy compound having one or more polymerizable unsaturated double bonds.

Further, the radiation curable resin composition of the present invention is characterized in that the monoepoxy compound (C) employed as a structural component is glycidyl(meta)acrylate and α-methylglycidyl(meta)acrylate.

The radiation curable resin composition of the present invention is characterized in the inclusion of a photo initiator in a radiation curable resin composition which includes the aprotic ammonium salt group shown by general formula 1 in the amount of 0.1 to 4.0 mol/kg.

Further, the present invention also relates to a method of production for a radiation curable resin composition. In this method, monocarboxylic acid (B) with one or more polymerizable unsaturated double bonds is used to form a quaternary ammonium from a polymer of a compound (D), which has polymerizable unsaturated double bond and a tertiary amino group, and/or from a copolymer (A) which has an amino group, copolymer (A) being a copolymer of compound (D) which has a tertiary amino group and a compound (E) which has polymerizable unsaturated double bonds that are copolymerizable with (D). Monoepoxy compound (C) is then reacted with this quaternary ammonium, to form a radiation curable resin characterized in the inclusion of aprotic ammonium salt groups shown by the general formula 1.

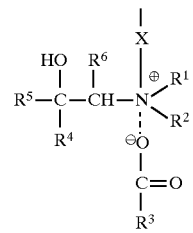

(In the formula, X is an organic group which is bound to the main chain and includes a hydrocarbon of 0 to 3 carbon atoms, an ester and an amide. R1 and R2, which may be the same or different, represent a hydrocarbon of 1 to 8 carbons which may be substituted with a hydroxyl group, ester group, alkoxy group or halogen atom. Further, R1 and R2 may bond together, with bonding occurring between the nitrogen atoms of R1 and R2 to form a heterocyclic ring. R3 indicates a hydrogen atom or a hydrocarbon of 1 to 18 carbon atoms that has one or more polymerizable unsaturated double bonds and may be substituted with a hydroxyl group, ester group, alkoxy group or halogen atom. R4, R5 and R6, which may be the same or different, represent a hydrogen atom or a hydrocarbon of 1 to 18 hydrocarbons which may be substituted with a hydroxyl group, ester group, alkoxy group or halogen atom. Further, R5 and R6 may bond together to form a heterocyclic ring.)

Further, the present invention also relates to a method of production for a radiation curable resin composition characterized in the inclusion of the aprotic ammonium salt indicated by general formula 1 and an ether group generated by a reaction between an alcoholic hydroxyl group and a glycidyl group. In this method, monocarboxylic acid (B) with one or more polymerizable unsaturated double bonds is used to form a quaternary ammonium from a copolymer (A) which has an amino group, copolymer (A) being a copolymer of a compound (D), which has polymerizable unsaturated double bonds and a tertiary amino group, and a compound (F), which has alcoholic hydroxyl groups and polymerizable unsaturated double bonds which are copolymerizable with compound (D); and/or being a copolymer of compound (D), compound (F) and a compound (E) which has polymerizable unsaturated double bonds that are copolymerizable with compound (D) and compound (F). A monoepoxy compound is then reacted with this quaternary ammonium and the alcoholic hydroxyl group to form the resin composition of the present invention.

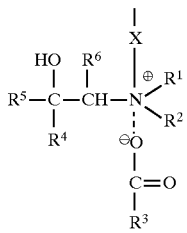

(In the formula, X is an organic group which is bound to the main chain and includes a hydrocarbon of 0 to 3 carbon atoms, an ester and an amide. R1 and R2, which may be the same or different, represent a hydrocarbon of 1 to 8 carbons which may be substituted with a hydroxyl group, ester group, alkoxy group or a halogen atom. Further, R1 and R2 may bond together, with bonding occurring between the nitrogen atoms of R1 and R2 to form a heterocyclic ring. R3 indicates a hydrogen atom or a hydrocarbon of 1 to 18 carbon atoms that has one or more polymerizable unsaturated double bonds and may be substituted with a hydroxyl group, ester group, or alkoxy group or halogen atoms. R4, R5 and R6, which may be the same or different, represent a hydrogen atom or a hydrocarbon of 1 to 18 hydrocarbons which may be substituted with a hydroxyl group, ester group, alkoxy group, or halogen atom. Further, R5 and R may bond together to form a heterocyclic ring.)

DESCRIPTION OF THE PREFERRED EMBODIMENTS

The present invention will now be explained in greater detail.

The radiation curable resin composition of the present invention has an number average molecular weight which is in the range of 500 to 50,000, and preferably between 500 to 30,000, but still more preferably in the range of 700 to 15,000, the resin including the aprotic ammonium salt group shown by general formula 1 in the amount of 0.1 to 4.0 mol/kg. In the production method for this resin, monocarboxylic acid (B) having one or more polymerizable unsaturated double bonds is used to form ammonium from a polymer of a compound (D) which has polymerizable unsaturated bonds and a tertiary amino group; from a copolymer of compound (D) and a compound (F), which has an alcoholic hydroxyl group and polymerizable unsaturated double bonds which are copolymerizable with compound (D); from a copolymer of compound (D) and one or more compounds (E) which have one or more unsaturated double bonds that are copolymerizable with compound (D); or from a copolymer of compound (F), which has an alcoholic hydroxyl group and polymerizable unsaturated double bonds that are copolymerizable with compound (D), and one or more compounds (E), which have one or more unsaturated double bonds which are copolymerizable with compound (D). An epoxy compound (C1) which does not have unsaturated double bonds and/or epoxy compound (C2) which has one or more unsaturated double bonds is then added to the ammonium to obtain the aforementioned resin composition.

When the number average molecular weight is 50,000 or more, the resin does not dissolve sufficiently in water, whereas when the number average molecular weight is 500 or less sufficient water resistance cannot be obtained. Further, the reaction is preferably carried out with epoxy compound (C1), which does not have unsaturated double bonds, and/or epoxy compound (C2), which has one or more unsaturated double bonds, added in the amount of 0.1 to 1.5 moles with respect to the sum of the molar quantities of the tertiary amino groups and the alcoholic hydroxyl groups in the resin. Quantities in excess of this lead to formation of epoxy group homopolymers, while quantities below this amount result in insufficient formation of the quaternary ammonium salt.

Representative examples of compound (D) which has one or more amino groups and one or more unsaturated double bonds include N,N-dimethylamino ethyl acrylate, N,N-diethylamino ethyl acrylate, N,N-di-n-propylamino ethyl acrylate, N,N-di-i-propylamino ethyl acrylate, N,N-dimethylamino propyl acrylate, N,N-diethylamino propyl acrylate, N,N-di-n-propylamino propyl acrylate, N,N-di-i-propylamino propyl acrylate, N,N-dimethylamino ethyl methacrylate, N,N-diethylamino ethyl methacrylate, N,N-di-n-propylamino ethyl methacrylate, N,N-di-i-propylamino ethyl methacrylate, N,N-dimethylamino propyl methacrylate, N,N-diethylamino propyl methacrylate, N,N-di-n-propylamino propyl methacrylate, N,N-di-i-propylamino propyl methacrylate, vinylpyridine and the like.

Further, also available as representative examples of compound (D) are ester compounds obtained by reacting equivalent molars of methacrylic acid, acrylic acid or methacrylic chloride and tertiary alkanol amines; and additive compounds obtained by reacting equivalent molars of mono-secondary amine compounds and acrylates or methacrylates which have an epoxy group, such as glycidyl methacrylate, glycidyl acrylate, 2-methyl-2,3-epoxypropyl acrylate and 2-methyl-2,3-epoxypropyl acrylate or the like.

Further, typical examples of compound (E) which has other polymerizable unsaturated double bonds that are copolymerizable with compound (D) include styrene, chlorostyrene, α-methylstyrene, divinylbenzene; acrylate, methacrylate and fumarate, having as substituents methyl, ethyl, propyl, isopropyl, n-butyl, isobutyl, t-butyl, amyl, 2-ethylhexyl, octyl, capryl, nonyl, dodecyl, hexadecyl, octadecyl, cyclohexyl, isobornyl, dicyclopentyl, methoxyethyl, butoxyethyl, 2-hydroxyethyl, 2-hydroxypropyl, 3-chloro-2-hydroxypropyl, acryl, methacryl, oleyl or tetrahydrofurfuryl; a monoacrylate or monomethacrylate of polyethylene glycol, or a monoacrylate or monomethacrylate of polypropylene glycol; 2-, 3- or 4- vinylpyridine, vinyl acetate, vinyl butyrate or vinyl benzoate; acrylic acid or methacrylic acid; acrylamide, methacrylamide, N-hydroxymethylacrylamide or N-hydroxymethylmethacrylamide; acrylonitrile or maleic anhydride. These may be used alone, or in combinations of two or more. It is preferable that the quantity of compound (D) here be in the range of 0.1 to 4.0 mol/kg.

Further, representative examples of compound (F) which has an alcoholic hydroxyl group and other polymerizable unsaturated double bonds which are copolymerizable with compound (D) include hydroxyalkyl(meth)acrylates such as 2-hydroxyethyl(meth)acrylate, hydroxypropyl(meth)acrylate, and 4-hydroxybutyl(meth)acrylate, as well as ε-caprolactone additives thereof, hydroxyalkyl vinyl ethers such as hydroxyethyl vinyl ether and hydroxybutyl vinyl ether, as well as ε-caprolactone additions thereof; and 3-chloro-2-hydroxypropyl(meth)acrylate, cyclohexyldimethanol mono(meth)acryl ester, as well as ε-caprolactone additions thereof. Further, other examples include (meth)acrylates having an alcoholic hydroxyl group obtained by adding water, hydrochloric acid or the like to the epoxy group of glycidyl methacrylate or grycidyl acrylate. In this case, it is preferable that the quantity of compound (D) be in the range of 0.1 to 4.0 mol/kg.

By using monocarboxylic acid (B) having one or more polymerizable unsaturated double bonds to form a quaternary ammonium from a copolymer (A) which has an amino group, and then reacting the ammonium with epoxy compound (C) to form a hydrophillic quaternary ammonium salt in the resin in the amount of 0.1 to 4.0 mol/kg, the resin composition can be rendered easily dilutable in water, as well as redissolvable in water prior to hardening.

When the quantity of the hydrophillic quaternary ammonium salt exceeds 4.0 mol/kg, it is not possible to obtain sufficient water resistance, whereas at amounts below 0.1 mol/kg it is not possible to obtain sufficient solvency in water. The structure of the obtained copolymer may be a random, alternating, block, graft or the like.

Known compounds may be employed for the monocarboxylic acid (B) which has one or more unsaturated double bonds and is used during neutralization, these including monocarboxylic acids or like wherein acrylic acid, methacrylic acid, acrylic acid dimer, methacrylic acid dimer, lactone denatured acrylate or dibasic acid anhydride is reacted with a compound having one or more polymerizable unsaturated double bonds and a hydroxyl group. These may be employed singularly or in combinations of two or more.

Typical representatives of the epoxy compound (C1) include glycidol, epichlorohydrin, phenyl glycidyl ether, ethylene oxide, propylene oxide, styrene oxide, cyclohexane oxide, bisphenol A diglycidyl ether, bisphenol F diglycidyl ether, bisphenol hexafluoroacetone diglycidyl ether, bisphenol epoxy, and the like.

Specific examples of compound (C2) which has one or more unsaturated double bonds and an epoxy group include α-methyl glycidyl acrylate, α-methyl glycidyl methacrylate, glycidyl acrylate, glycidyl methacrylate, and aryl glycidyl ether. More specifically, the following examples represented by the general formulas 7 through 21 below may be cited.

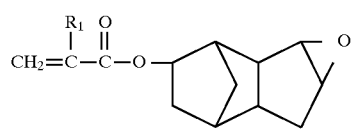 (I)

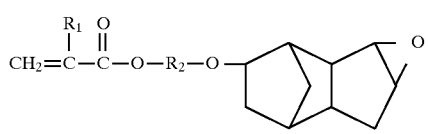 (II)

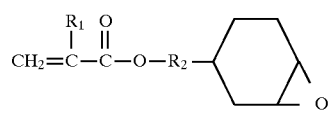 (III)

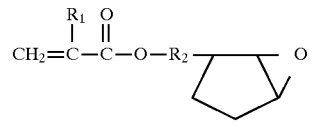 (IV)

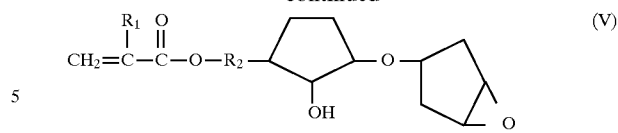 (V)

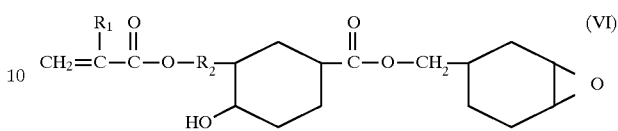 (VI)

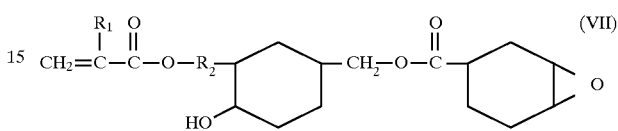 (VII)

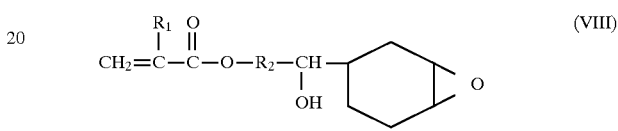 (VIII)

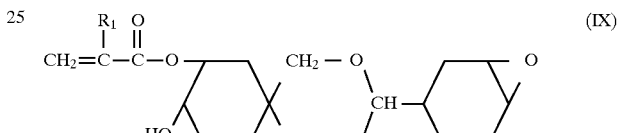 (IX)

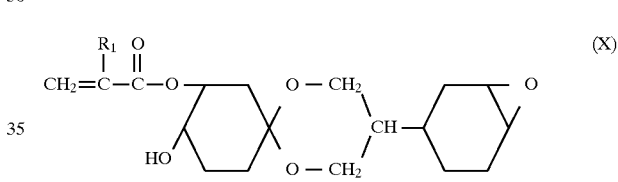 (X)

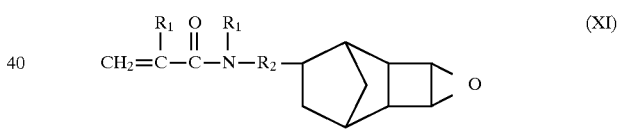 (XI)

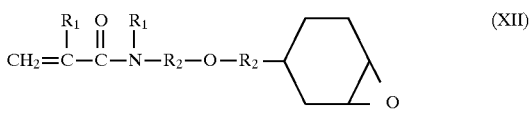 (XII)

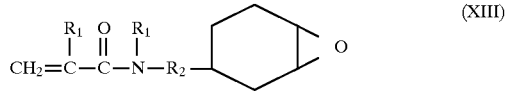 (XIII)

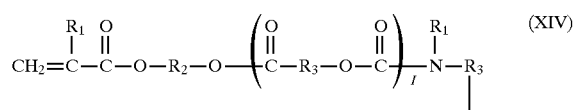 (XIV)

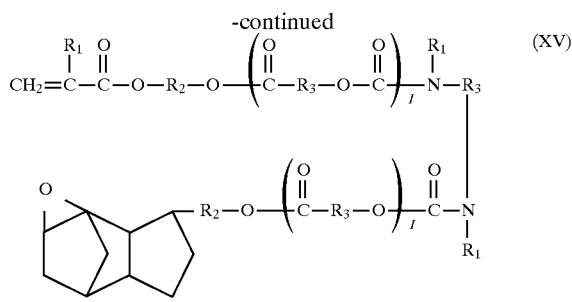

(In the formulas, R1 is a hydrogen atom or methyl group; R2 is a bivalent aliphatic saturated hydrocarbon of 1 to 6 carbons; and R3 is a bivalent hydrocarbon of 1 to 10 carbons. I indicates an integer between 0 and 10.)

Additional examples of compound (C2) include compounds and resins wherein acrylic acid and methacrylic acid are added to an epoxy compound and resin containing epoxy groups in the amount of 10 to 95 molar percent, and preferably in the amount of 30 to 95 molar percent, but more preferably in the amount of 50 to 95 molar percent, with respect to the epoxy groups in one molecule. Specifically, a glycidyl ether derived epoxy resin, for example, bisphenol A derived epoxy resin obtained by reacting bisphenol A and epichlorohydrin in the presence of an alkali, an epoxy compound of a resin wherein a condensation reaction was carried out between bisphenol A and formalin, or a compound which employs a brominated bisphenol A in place of bisphenol A.

Denaturated compounds and the like are also available, including a novolak type epoxy resin wherein epichlorohydrin is reacted with novolak resin to carry out glycidyl etherification, phenol novolak type resins, orthocresol novolak type resins, paratertiarybutyl phenol type resins, and the like.

Further, also available are bisphenol F derived epoxy resins obtained by reacting epichlorohydrin with bisphenol F, and brominated epoxy resins derived from tetrahydrobisphenol A, and the like. Also available are cyclic aliphatic epoxy resins having cyclohexane oxide groups, tricyclodesane oxide groups, or cyclopentane oxide groups.

Also available are glycidyl ester resins such as diglycidyl phthalate, diglycidyl tetrahydrophthalate, diglycidyl hexahydrophthalate, diglycidyl-p-oxybenzonate, glycidyl dimerate, and the like; glycidyl amine derived resins such as tetraglycidyl amino diphenyl methane, triglycidyl para amino phenol, diglycidyl aniline, diglycidyl toluidine, tetragycidyl metaxylene diamine, diglycidyl tribromaniline, tetraglycidyl bisamino methylcyclohexane and the like; hydantoin type epoxy resins wherein hydantoin rings have been glycidylized; and triglycidyl isocyanate having triazine rings. These may be used alone or in combinations of two or more. Further, also available are compounds and resin compositions wherein acrylic acid and methacrylic acid have been added to these compounds and resin compositions.

In the production method according to the present invention, when copolymer (A) having an amino group has an alcoholic hydroxyl group, monocarboxylic acid (B) can be used to convert the amino group into a quaternary ammonium, and epoxy compound (C) can be used to form a quaternary ammonium salt from the ammonium group. At the same time, the reaction between the epoxy groups and the alcoholic hydroxyl groups in the resin occurs readily at moderate conditions below 100° C., without requiring the addition of a separate catalyst.

When hardening the photosensitive resin composition of the present invention using UV irradiation, a polymerizable photo initiator or a photosensitizer may be employed. There are no particular limitations placed on the polymerizable photo initiator employed. Namely, a conventionally employed polymerizable photo initiator may be used, typical examples including 4-dimethylamino benzoic acid, 4-dimethyl amino benzoate, alkoxyacetophenone, benzophenone and benzopenone derivatives, benzoyl alkyl benzoic acid, bis(4-dialkyl aminophenyl)ketone, benzyl and benzyl derivatives, benzoin and benzoin derivatives, benzoin alkyl ether, 2-hydroxyl-2-methylpropiophenone, 1-hydroxycyclohexyl phenyl ketone, 2,4,6-trimethylbenzoyl diphenoyl phosphine oxide, 2-methyl-1-[4-(methylthio) phenyl]-2-morpholinopropane- 1, 2-benzyl-2-dimethylamino- 1 -(4-morpholinophenyl)-butanone-1, acetophenones like acetophenone, 2-2,dimethoxy-2-phenylacetophenone, 2,2-diethoxy-2-phenylacetophenone, and 1,1 -dichloroacetophenone, anthraquinones like 2-methylanthraquinone, 2-ethylanthraquinone, 2-tertiarybutyl anthraquinone, 1-chloroanthraquinone, and 2-aluminum anthraquinone, thioxanthones like 2,4-dimethylthioxanthone, 2,4-diethylthioxanthone, 2-chrolothioxanhone, 2,4-diisopropylthioxanthone, ketals like acetophenone dimethyl ketal and benzyl dimethyl ketal, xanthones and the like.

The amount of the polymerizable photo initiator added is typically 0.2 to 30 parts by weight, and preferably 0.5 to 20 parts by weight, to 100 parts by weight of the resin in solid form. The polymerizable photo initiator may be employed by combining one or two or more conventionally known photo polymerization promoters.

An organic solvent may be included in the radiation curable resin composition as necessary. Typical examples of such an organic solvent include ketones such as methyl ethyl ketone and cyclohexane; aromatic hydrocarbons such as toluene and xylene; cellosolves such as cellosolve and butyl cellosolve; carbitols such as carbitol and butyl carbitol; and acetates such as ethyl acetate, butyl acetate, cellosolve acetate, butyl cellosolve acetate, carbitol acetate and butyl carbitol acetate. These may be used alone or in combinations of two or more.

Further, the composition of the present invention may include β-hydroxyethyl acrylate, β-hydroxypropyl acrylate, glycidyl acrylate, β-hydroxyethyl acryloyl phosphate, dimethylamino ethyl acrylate, diethylamino ethyl acrylate, ethylene glycol diacrylate, diethylene glycol diacrylate, triethylene glycol diacrylate, polyethylene glycol diacrylate, propylene glycol diacrylate, dipropylene glycol diacrylate, tripropylene glycol diacrylate, polypropylene glycol diacrylate, trimethylol propane diacrylate, trimethylol propane triacrylate, pentaerythritol triacrylate, pentaerythritol tetracrylate, dipentaerythritol tetracrylate, dipentaerythritol pentacrylate, dipentaerythritol hexacrylate, or tris(2-acrylolxyethyl)isocyanate. In addition, the composition of the present invention may also include all methacrylates of aforementioined acrylates; monoesters, diesters, triesters or higher polyesters of a polybasic acid and hydroxyalkyl (meta)acrylate; or monomers, oligomers or prepolymers having ethylenic unsaturated double bonds, such as bisphenol A type epoxy acrylate, novolak type epoxy acrylate or urethane acrylate.

Further, as necessary, various additives may be added to the composition of the present invention including known fillers such as barium sulfate, silicium sulfide, talc, clay, and calcium carbonate; known tinting pigments such as phthalocyanine blue, phthalocyanine green, titanium oxide, carbon black and the like; defoaming agents; agents which provide adhesive ability; and leveling agents. In addition, known polymerization inhibitors such as hydroquinone, hydroquinone monomethyl ether, pyrogallol, tertiarybutylcatechol, and phenothiazine may also be added to the composition of the present invention.

The radiation curable resin composition of the present invention has an excellent hardening ability, and can be dissolved with water or an organic solvent prior to hardening. Further, upon hardening, the resin forms a film which has excellent resistance to water, solvents, chemicals, and heat. The energy rays used in the present invention refernerically to ionizable radioactive rays such as electron rays, αrays, βrays, γrays, X rays, neutron rays or UV rays; heat rays; infrared rays; or far infrared rays.

PREFERRED EMBODIMENTS

The present invention will now be explained in greater detail employing examples and example applications. "Parts" or "%" as used here indicate weight standards.

Synthesis Example 1

176.9 parts of carbitol acetate was placed in a flask equipped with a thermometer, stirrer, dropping funnel and circulating cooling tube, and heated to 90° C. in a nitrogen environment. A mixed solution of 393.0 parts of dimethylamino ethyl methacrylate, 260.5 parts styrene, 175 parts carbitol acetate, and 32.68 parts perbutyl O (manufactured by NOF Corp.) was added dropwise over 3 hours. Stirring was then carried out for 4 hours, to obtain a resin solution. This will be designated as resin A hereinafter.

Synthesis Example 2

179.1 parts of carbitol acetate was placed in a flask equipped with a thermometer, stirrer, dropping funnel and circulating cooling tube, and heated to 100° C. in a nitrogen environment. A mixed solution of 235.8 parts of dimethylamino ethyl methacrylate, 301.3 parts methyl methacrylate, 179 parts carbitol acetate, and 26.86 parts perbutyl D (manufactured by NOF Corp.) was added dropwise over 2 hours. Stirring was then carried out for 3 hours, to obtain a resin solution. This will be designated as resin B hereinafter.

Synthesis Example 3

332.9 parts of methyl ethyl ketone was placed in a flask equipped with a thermometer, stirrer, dropping funnel and circulating cooling tube, and heated to 80° C. in a nitrogen environment. A mixed solution of 314.4 parts of dimethylamino ethyl methacrylate, 156.3 parts styrene, 195 parts hydroxyethyl methacrylate, 332.9 parts methyl ethyl ketone, and 39.94 parts perbutyl O (manufactured by NOF Corp.) was added dropwise over 4 hours. Stirring was then carried out for 4 hours, to obtain a resin solution. This will be designated as resin C hereinafter.

Synthesis Example 4

384.1 parts of carbitol acetate was placed in a flask equipped with a thermometer, stirrer, dropping funnel and circulating cooling tube, and heated to 100° C. in a nitrogen environment. A mixed solution of 314.0 parts of dimethylamino ethyl methacrylate, 129.2 parts methyl methacrylate, 65 parts hydroxyethyl methacrylate, 260 parts styrene, 384.1 parts carbitol acetate and 38.4 parts perbutyl D (manufactured by NOF Corp.) was added dropwise over 2 hours. Stirring was then carried out for 3 hours, to obtain a resin solution. This will be designated as resin D hereinafter.

Synthesis Example 5

198.3 parts of methyl ethyl ketone was placed in a flask equipped with a thermometer, stirrer, dropping funnel and circulating cooling tube, and heated to 70° C. in a nitrogen environment. A mixed solution of 286.4 parts of dimethylamino ethyl acrylate, 208.4 parts styrene, 100.1 parts methyl methacrylate, 198.3 parts methyl ethyl ketone, and 46.5 parts perbutyl O (manufactured by NOF Corp.) was added dropwise over 2 hours. Stirring was then carried out for 5 hours, to obtain a resin solution. This will be designated as resin E hereinafter.

Synthesis Example 6

165.0 parts of dipropylene glycol monomethyl ether was placed in a flask equipped with a thermometer, stirrer, dropping funnel and circulating cooling tube, and heated to 110° C. in a nitrogen environment. A mixed solution of 157.0 parts of dimethylamino ethyl methacrylate, 208.0 parts styrene, 130.0 parts hydroethylxymethacrylate, 165.0 parts dipropylene glycol monomethyl ether, and 24.75 parts perbutyl (NOF Corp.) was added dropwise over 3 hours. Stirring was then carried out for 5 hours, to obtain a resin solution. This will be designated as resin F hereinafter.

Synthesis Example 7

328.7 parts of dipropylene glycol monomethyl ether was placed in a flask equipped with a thermometer, stirrer, dropping funnel and circulating cooling tube, and heated to 110° C. in a nitrogen environment. A mixed solution of 105.1 parts of vinyl pyridine, 208.0 parts styrene, 130.0 parts hydroethylxymethacrylate, 50.0 parts methyl methacrylate, and 39.45 parts perbutyl 0 (manufactured NOF Corp.) was added dropwise over 4 hours. Stirring was then carried out for 5 hours, to obtain a resin solution. This will be designated as resin G hereinafter.

Synthesis Example 8

328.7 parts of dipropylene glycol monomethyl ether was placed in a flask equipped with a thermometer, stirrer, dropping funnel and circulating cooling tube, and heated to 80° C. in a nitrogen environment. A mixed solution of 157.0 parts of dimethylamino ethyl methacrylate, 200.0 parts methyl methacrylate, and 15.85 parts AIBN was added dropwise over 2 hours. Stirring was then carried out for 6 hours, to obtain a resin solution. This will be designated as resin H hereinafter.

Synthesis Example 9

328.7 parts of dipropylene glycol monomethyl ether was placed in a flask equipped with a thermometer, stirrer, dropping funnel and circulating cooling tube, and heated to 90° C. in a nitrogen environment. A mixed solution of 125.6 parts of dimethylamino ethyl methacrylate, 250.0 parts methyl methacrylate, 130.0 parts hydroethyl methacrylate, and 28.0 parts ABN-E (manufactured by NIHON HYDRAZINE CORP.) was added dropwise over 2 hours. Stirring was then carried out for 6 hours, to obtain a resin solution. This will be designated as resin I hereinafter.

Synthesis Example 10

318.9 parts of dipropylene glycol monomethyl ether was placed in a flask equipped with a thermometer, stirrer, dropping funnel and circulating cooling tube, and heated to 90° C. in a nitrogen environment. A mixed solution of 62.8 parts of dimethylamino ethyl methacrylate, 280.3 parts methyl methacrylate, 104.0 parts hydroethyl methacrylate, and 31.3 parts ABN-E (manufactured by NIHON HYDROZINE CORP.) was added dropwise over 2 hours.

Stirring was then carried out for 4 hours, to obtain a resin solution. This will be designated as resin J hereinafter.

Synthesis Example 11

95.7 parts of isopropyl alcohol was placed in a flask equipped with a thermometer, stirrer, dropping funnel and circulating cooling tube, and heated to 80° C. in nitrogen environment. A mixed solution of 157.0 parts of dimethylamino ethyl methacrylate, 130.0 parts hydroxyethyl methacrylate, 95.7 parts isopropyl alcohol, and 18.66 parts ABN-E (manufactured by NIHON HYDRAZINE CORP.) was added dropwise over 2 hours. Stirring was then carried out for 4 hours, to obtain a resin solution. This will be designated as resin K hereinafter.

Synthesis Example 12

170 parts of carbitol acetate was placed in a flask equipped with a thermometer, stirrer, dropping funnel and circulating cooling tube, and heated to 90° C. in a nitrogen environment. A mixed solution of 78.5 parts of dimethylamino ethyl methacrylate, 301.3 parts methyl methacrylate, 130 parts hydroxyethyl methacrylate, 170 parts carbitol acetate and 30.59 parts ABN-R (manufactured by NIHON HYDRAZINE CORP.) was added dropwise over 2 hours. Stirring was then carried out for 5 hours, to obtain a resin solution. This will be designated as resin L hereinafter.

Synthesis Example 13

198.5 parts of methylethyl ketone was placed in a flask equipped with a thermometer, stirrer, dropping funnel and circulating cooling tube, and heated to 75° C. in a nitrogen environment. A mixed solution of 157.0 parts of dimethylamino ethyl methacrylate, 208.4 parts styrene, 100.1 parts methyl methacrylate, 130.0 parts hydroxyethyl methacrylate, 198.5 methyl ethyl ketone and 41.69 parts ABN-R (manufactured by NIHON HYDRAZINE CORP.) was added dropwise over 3 hours. Stirring was then carried out for 5 hours, to obtain a resin solution. This will be designated as resin M hereinafter.

Comparative Synthesis Example 1

50 parts of butyl methacrylate, 50 parts of dimethyl amino ethyl methacrylate, and 100 parts of 2-propyl alcohol were placed in a flask equipped with a thermometer, stirrer, dropping funnel and circulating cooling tube, and heated to 80° C. in a nitrogen environment while stirring. 0.5 parts azobisisobutyronitrile was added, with the solution maintained at 80° C. for one hour. Next, five additions of 0.1 parts of azobisisobutronitrile O each were added at 30 minute intervals. After the final addition, the solution was maintained for 3 hours to complete the reaction, thereby obtaining the resin solution. This will be designated as resin N hereinafter.

Comparative Synthesis Example 2

179.5 parts of propylene glycol monomethyl ether acetate was added to a flask equipped with a thermometer, stirrer, dropping funnel and circulating cooling tube, and heated to 75° C. in a nitrogen environment. A mixture of 208.4 parts styrene, 200.2 parts methyl methacrylate, 130.0 parts hydroxyethyl methacrylate, 179.5 parts methyl ethyl ketone and 35.01 parts ABN-R (manufactured by NIHON HYDRAZINE CORP.) was then added dropwise over 2 hours. The mixture was then stirred for 4 hours, at the end of which the resin solution was obtained. This will be designated as resin O hereinafter.

Example 1

Resin A was added in the amount of 1,038.08 parts to a flask equipped with a thermometer, stirrer, and circulating cooling tube, and heated to 80° C. 0.39 parts methyl hydroquinone and 181 parts acrylic acid were then added and stirred for 30 minutes. 357 parts glycidyl methacrylate and 80.5 parts carbitol acetate were added and stirred for 4 hours to obtain a solution of a resin which had a number average molecular weight of 7,550. This will be designated as resin A-1 hereinafter.

Example 2

Resin A was added in the amount of 1,038.08 parts to a flask equipped with a thermometer, stirrer, and circulating cooling tube, and heated to 90° C. 0.39 parts methyl hydroquinone and 181 parts acrylic acid were then added and stirred for 30 minutes. 387 parts α-methyl glycidyl methacrylate was added and stirred for 5 hours to obtain a solution of a resin which had a number average molecular weight of 7,740. This will be designated as resin A-2 hereinafter.

Example 3

Resin B was added in the amount of 922.06 parts to a flask equipped with a thermometer, stirrer, and circulating cooling tube, and heated to 80° C. 0.27 parts methyl hydroquinone and 108.6 parts acrylic acid were then added and stirred for 30 minutes. 111.2 parts glycidol was added and stirred for 3 hours to obtain a solution of a resin which had a number average molecular weight of 5,680. This will be designated as resin B-1 hereinafter.

Example 4

Resin B was added in the amount of 922.06 parts to a flask equipped with a thermometer, stirrer, and circulating cooling tube, and heated to 90° C. 0.27 parts methyl hydroquinone and 129.6 parts methacrylic acid were then added and stirred for 30 minutes. 214.8 parts glycidyl methacrylate was added and stirred for 4 hours to obtain a solution of a resin which had a number average molecular weight of 5,940. This will be designated as resin B-2 hereinafter.

Example 5

Resin C was added in the amount of 1,370.54 parts to a flask equipped with a thermometer, stirrer, and circulating cooling tube, and heated to 90° C. 0.68 parts methyl hydroquinone and 144.8 parts acrylic acid were then added and stirred for 30 minutes. 300.4 parts glycidylhenyl ether was added and stirred for 4 hours to obtain a solution of a resin which had a number average molecular weight of 6,050. This will be designated as resin C-1 hereinafter.

Example 6

Resin C was added in the amount of 1,370.54 parts to a flask equipped with a thermometer, stirrer, and circulating cooling tube, and heated to 80° C. 0.68 parts methyl hydroquinone and 144.8 parts acrylic acid were then added and stirred for 30 minutes. 300.4 parts glycidyl methacrylate was added and stirred for 4 hours to obtain a solution of a resin which had a number average molecular weight of 6,100. This will be designated as resin C-2 hereinafter.

Example 7

Resin D was added in the amount of 1,574.80 parts to a flask equipped with a thermometer, stirrer, and circulating cooling tube, and heated to 80° C. 0.79 parts methyl hydroquinone and 144.8 parts acrylic acid were then added and stirred for 30 minutes. 300.4 parts α-methylglycidyl methacrylate was added and stirred for 5 hours to obtain a solution of a resin which had a number average molecular weight of 3,560. This will be designated as resin D-1 hereinafter.

Example 8

Resin D was added in the amount of 1,574.80 parts to a flask equipped with a thermometer, stirrer, and circulating cooling tube, and heated to 80° C. 0.72 parts methyl hydroquinone and 144.8 parts acrylic acid were then added and stirred for 30 minutes. 148.2 parts glycidol was added and stirred for 5 hours to obtain a solution of a resin which had a number average molecular weight of 3,410. This will be designated as resin D-2 hereinafter.

Example 9

Resin E was added in the amount of 1,038.0 parts to a flask equipped with a thermometer, stirrer, and circulating cooling tube, and heated to 90° C. 0.62 parts methyl hydroquinone and 144.8 parts acrylic acid were then added and stirred for 30 minutes. 300.4 parts glycidyl phenyl ether was added and stirred for 3 hours to obtain a solution of a resin which had a number average molecular weight of 7,700. his will be designated as resin E- 1 hereinafter.

Example 10

Resin E was added in the amount of 1,038.0 parts to a flask equipped with a thermometer, stirrer, and circulating cooling tube, and heated to 70° C. 0.62 parts methyl hydroquinone and 144.8 parts acrylic acid were then added and stirred for 30 minutes. 300.2 parts glycidyl methacrylate was added and stirred for 5 hours to obtain a solution of a resin which had a number average molecular weight of 7,690. This will be designated as resin E-2 hereinafter.

Example 11

Resin F was added in the amount of 849.75 parts to a flask equipped with a thermometer, stirrer, and circulating cooling tube, and heated to 80° C. 0.51 parts methyl hydroquinone and 72.2 parts acrylic acid were then added and stirred for 30 minutes. 150.1 parts glycidyl methacrylate was added and stirred for 4 hours to obtain a solution of a resin which had a number average molecular weight of 6,820. This will be designated as resin F-1 hereinafter.

Example 12

Resin F was added in the amount of 849.75 parts to a flask equipped with a thermometer, stirrer, and circulating cooling tube, and heated to 90° C. 0.51 parts methyl hydroquinone and 84.6 parts methacrylic acid were then added and stirred for 30 minutes. 150.2 parts glycidyl phenyl ether was added and stirred for 3 hours to obtain a solution of a resin which had a number average molecular weight of 6,830. This will be designated as resin F-2 hereinafter.

Example 13

Resin G was added in the amount of 861.28 parts to a flask equipped with a thermometer, stirrer, and circulating cooling tube, and heated to 90° C. 0.51 parts methyl hydroquinone and 84.6 parts methacrylic acid were then added and stirred for 30 minutes. 182.2 parts 3,4-epoxycyclohexyl methyl acrylate was added and stirred for 3 hours to obtain a solution of a resin which had a number average molecular weight of 3,230. This will be designated as resin G-1 hereinafter.

Example 14

Resin G was added in the amount of 861.28 parts to a flask equipped with a thermometer, stirrer, and circulating cooling tube, and heated to 90° C. 0.51 parts methyl hydroquinone and 144.6 parts acrylic acid dimer were then added and stirred for 30 minutes. 150.1 parts glycidyl methacrylate was added and stirred for 3 hours to obtain a solution of a resin which had a number average molecular weight of 3,180. This will be designated as resin G-2 hereinafter.

Example 15

Resin H was added in the amount of 701.55 parts to a flask equipped with a thermometer, stirrer, and circulating cooling tube, and heated to 90° C. 0.51 parts methyl hydroquinone and 76.4 parts methacrylic acid were then added and stirred for 30 minutes. 150.1 parts glycidyl methacrylate was added and stirred for 3 hours to obtain a solution of a resin which had a number average molecular weight of 3,200. This will be designated as resin H-1 hereinafter.

Example 16

Resin H was added in the amount of 701.55 parts to a flask equipped with a thermometer, stirrer, and circulating cooling tube, and heated to 80° C. 0.51 parts methyl hydroquinone and 72.4 parts acrylic acid were then added and stirred for 30 minutes. 150.2 parts phenyl glycidyl ether was added and stirred for 3 hours to obtain a solution of a resin which had a number average molecular weight of 2,780. This will be designated as resin H-2 hereinafter.

Example 17

Resin I was added in the amount of 862.3 parts to a flask equipped with a thermometer, stirrer, and circulating cooling tube, and heated to 80° C. 0.51 parts methyl hydroquinone and 57.9 parts acrylic acid were then added and stirred for 1 hour. 123.4 parts α-methylglycidyl methacrylate was added and stirred for 4 hours to obtain a solution of a resin which had a number average molecular weight of 2,960. This will be designated as resin I-1 hereinafter.

Example 18

Resin I was added in the amount of 862.3 parts to a flask equipped with a thermometer, stirrer, and circulating cooling tube, and heated to 90° C. 0.51 parts methyl hydroquinone and 72.4 parts acrylic acid were then added and stirred for 30 minutes. 142.2 parts glycidyl methacrylate was added and stirred for 4 hours to obtain a solution of a resin which had a number average molecular weight of 1,980. This will be designated as resin I-2 hereinafter.

Example 19

Resin J was added in the amount of 862.3 parts to a flask equipped with a thermometer, stirrer, and circulating cooling tube, and heated to 80° C. 0.51 parts methyl hydroquinone and 57.9 parts acrylic acid dimer were then added and stirred for 1 hour. 61.7 parts α-methylglycidyl methacrylate was added and stirred for 4 hours to obtain a solution of a resin which had a number average molecular weight of 3,160. This will be designated as resin J-1 hereinafter.

Example 20

Resin I was added in the amount of 862.3 parts to a flask equipped with a thermometer, stirrer, and circulating cooling tube, and heated to 80° C. 0.51 parts methyl hydroquinone and 29.0 parts acrylic acid were then added and stirred for 1 hour. 142.2 parts glycidyl methacrylate was added and stirred for 4 hours to obtain a solution of a resin which had a number average molecular weight of 2,970. This will be designated as resin J-2 hereinafter.

Example 21

Resin K was added in the amount of 497.1 parts to a flask equipped with a thermometer, stirrer, and circulating cooling tube, and heated to 80° C. 0.79 parts methyl hydroquinone and 108.6 parts acrylic acid were then added and stirred for 30 minutes. 213.3 parts glycidyl methacrylate and 227.0 isopropyl alcohol were added and stirred for 4 hours to obtain a solution of a resin which had a number average molecular weight of 4,590. This will be designated as resin K-1 hereinafter. Representing the resins obtained here, resin K-1 was examine 13C-NMR and found to have peaks for carbon atoms (a) and (b) shown in general formula 2 below.

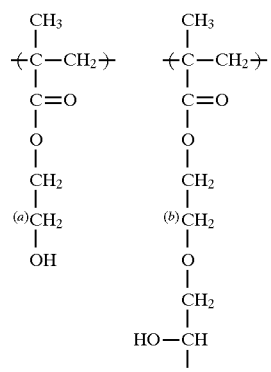

(a) :62.9 ppm, (b) :65.2 ppm. The extent of reaction can be calculated from the derivative value: (a): 36%, (b): 64%. It is confirmed that alcohol hydroxyl groups and epoxy groups were reacted.

Example 22

Resin K was added in the amount of 497.1 parts a flask equipped with a thermometer, stirrer, and circulating cooling tube, and heated to 80° C. 0.72 parts methyl hydroquinone and 172.8 parts methacrylic acid were then added and stirred for 30 minutes. 284.4 parts glycidyl methacrylate and 317.2 parts isopropyl alcohol were added and stirred for 4 hours to obtain a solution of a resin which had a number average molecular weight of 4,710. This will be designated as resin K-2 hereinafter. The reaction of the alcohol hydroxyl groups and the epoxy groups was confirmed to be a 76% reaction under 13C-NMR in the same manner as Example 21.

Example 23

Resin L was added in the amount of 880.39 parts to a flask equipped with a thermometer, stirrer, and circulating cooling tube, and heated to 80° C. 0.27 parts methyl hydroquinone and 72.4 parts acrylic acid were then added and stirred for 1 hour. 150.2 parts phenyl glycidyl ether and 168.7 parts carbitol acetate were added and stirred for 4 hours to obtain a solution of a resin which had a number average molecular weight of 7,380. This will be designated as resin L-1 hereinafter. The reaction of the alcohol hydroxyl groups and the epoxy groups was confirmed to be a 41% reaction under 13C-NMR in the same manner as Example 21.

Example 24

Resin L was added in the amount of 880.39 parts to a flask equipped with a thermometer, stirrer, and circulating cooling tube, and heated to 90° C. 0.27 parts methyl hydroquinone and 129.6 parts methacrylic acid were then added and stirred for 1 hour. 213.3 parts glycidyl methacrylate and 248.9 parts carbitol acetate were added and stirred for 4 hours to obtain a solution of a resin which had a number average molecular weight of 7,400. This will be designated as resin L-2 hereinafter. The reaction of the alcohol hydroxyl groups and the epoxy groups was confirmed to be a 57% reaction under 13C-NMR in the same manner as Example 21.

Example 25

Resin M was added in the amount of 1,034.2 parts to a flask equipped with a thermometer, stirrer, and circulating cooling tube, and heated to 90° C. 0.62 parts methyl hydroquinone and 287.6 parts acrylic acid dimer were then added and stirred for 1 hour. 284.4 parts glycidyl methacrylate and 409.1 parts methyl ethyl ketone were added and stirred for 3 hours to obtain a solution of a resin which had a number average molecular weight of 5,740. This will be designated as resin M-1 hereinafter. The reaction of the alcohol hydroxyl groups and the epoxy groups was confirmed to be a 65% reaction under 13C-NMR in the same manner as Example 21.

Example 26

Resin M was added in the amount of 1,034.2 parts to a flask equipped with a thermometer, stirrer, and circulating cooling tube, and heated to 70° C. 0.62 parts methyl hydroquinone and 144.8 parts acrylic acid were then added and stirred for 1 hour. 284.4 parts glycidyl methacrylate and 313.9 parts methyl ethyl ketone were added and stirred for 5 hours to obtain a solution of a resin which had a number average molecular weight of 6,090. This will be designated as resin M-2 hereinafter. The reaction of the alcohol hydroxyl groups and the epoxy groups was confirmed to be a 48% reaction under 13C-NMR in the same manner as Example 21.

Comparative Example 1

432 g of a creosol novolak type resin (Epicron N-680, epoxy weight: 216 g, manufactured by Dainippon Ink & Chemicals Inc.) and 432 g of dipropylene glycol monomethyl ether was added to a flask equipped with a thermometer, stirrer, and circulating cooling tube, and dissolved. 1.3 g of hydroquinone monomethyl ether and 144 g of acrylic acid were then added and reacted at 90° C. until the acid value dropped below 1. 152 g of tetrahydrophthalic anhydride and reacted at 90° C. until the acid value became 78, thereby obtaining a radiation curable resin. This will be designated P-1 hereinafter.

Comparative Example 2

432 g of a creosol novolak type resin (Epicron N-680, epoxy weight: 216 g, manufactured by Dainippon Ink & Chemicals Inc.) and 432 g of ethyl carbitol acetate was added to a flask equipped with a thermometer, stirrer, and circulating cooling tube, and dissolved. 1.3 g of hydroquinone monomethyl ether and 144 g of acrylic acid were then added and reacted at 90° C. until the acid value dropped below 1. 59.3 parts of piperidine was added and stirred for 3 hours, after which 63.1 parts of lactic acid was added to obtain a radiation curable resin. This will be designated as P-2 hereinafter.

Comparative Example 3

434 g of a creosol novolak type resin (Epicron N-695, epoxy weight: 217 g, manufactured by Dainippon Ink & Chemicals Inc.) and 432 g of dipropylene glycol monomethyl ether was added to a flask equipped with a thermometer, stirrer, and circulating cooling tube, and dissolved. 1.3 g of hydroquinone monomethyl ether and 144.8 g of acrylic acid were then added and stirred for 5 minutes. N-ethyl monomorpholine was then added in the amount of 69.12 parts and stirred for 3 hours, to obtain a radiation curable resin. This will be designated as P-3 hereinafter.

Comparative Example 4

1,038.08 parts of resin A was added to a flask equipped with a thermometer, stirrer, and circulating cooling tube, and heated to 90° C. 0.39 parts methyl hydroquinone and 225.3 parts lactic acid were then added and stirred for 30 minutes. Glycidyl methacrylate was then added in the amount of 357 parts and stirred for 5 hours, to obtain a solution of a resin having a number average molecular weight of 7,720. This will be designated as A-3 hereinafter.

Comparative Example 5

1,370.54 parts of resin C was added to a flask equipped with a thermometer, stirrer, and circulating cooling tube, and heated to 80° C. 0.68 pars of methyl hydroquinone and 180.2 parts of lactic acid were then added and stirred for 30 minutes. Glycidyl methacrylate was then added in the amount of 300.4 parts and stirred for 4 hours, to obtain a solution of a resin having a number average molecular weight of 6,220. This will be designated as C-3 hereinafter.

Comparative Example 6

300.1 parts of resin N, 19.1 parts of acetic acid, and 600 parts of deionized water were added to a flask equipped with a thermometer, stirrer, and circulating cooling tube. The mixture was heated while stirring and 2-propyl alcohol was removed using azeotropic distillation. The reactants were cooled to room temperature, and left to sit overnight. 4.5 parts glycidyl methacrylate was then added, heated to 80° C. and maintained for 4 hours to complete the reaction. In this way, a solution of a resin having a number average molecular weight of 16,000 was obtained. This will be designated as N-1 hereinafter.

Comparative Example 7

300.1 parts of resin N was added to a flask equipped with a thermometer, stirrer, and circulating cooling tube, followed by the addition of 19.1 parts acetic acid and 600 parts deionized water. The mixture was heated while stirring and 2-propyl alcohol was removed using azeotropic distillation. The reactants were cooled to room temperature, and left to sit overnight. 45.1 parts glycidyl methacrylate was added, heated to 80° C. and maintained for 4 hours to complete the reaction. In this way, a solution of a resin of a number average molecular weight of 16,500 was obtained. This will be designated as N-2 hereinafter.

Comparative Example 8

897.6 parts of resin O was added to a flask equipped with a thermometer, stirrer, and circulating cooling tube, and heated to 80° C. 0.62 parts methylhydroquinone and 72.4 parts acrylic acid were then added and stirred for 1 hour. Glycidyl methacrylate was then added in the amount of 142.2 parts and stirred for 4 hours, to obtain a solution of a resin having a number average molecular weight of 7,810. This will be designated as resin O-1 hereinafter. The reaction of alcoholic hydroxyl groups and epoxy groups was confirmed under 13C-NMR in the same manner as Example 21, however the reaction was not confirmed.

Comparative Example 9

897.6 parts of resin O was added to a flask equipped with a thermometer, stirrer, and circulating cooling tube, and heated to 70° C. 0.62 parts methylhydroquinone and 60.0 parts acetic acid were then added and stirred for 1 hour. Glycidyl methacrylate was then added in the amount of 142.2 parts and stirred for 4 hours, to obtain a solution of a resin having a number average molecular weight of 7,430. This will be designated as O-1 hereinafter. The reaction of alcoholic hydroxyl groups and epoxy groups was confirmed under 13C-NMR in the same manner as Example 21, however the reaction was not confirmed.

Application Examples 1~26

Each of the resins obtained in Examples 1 through 26 was combined in an amount of 100 parts with 3 parts of 1-hydroxyhexylphenylketone, and stirred to mix sufficiently, thereby obtaining the coating material.

Next, each of the obtained coating materials were coated to a water-polished tin plate at a thickness of 20 $\mu$m. This was dried for 10 minutes under a 75° C. warm blower. The coating was then hardened under an 80 W high pressure mercury lamp by irradiating for 30 seconds from a height of 15 cm. The results of evaluations of the capabilities of the obtained coating are shown in Tables 1 and 3.

Comparative Application Examples 1~7

Each of the resins obtained in Comparative Examples 1 through 7 was combined in an amount of 100 parts with 3 parts of 1-hydroxyhexylphenylketone, and stirred to mix sufficiently, thereby obtaining the coating material.

Next, each of the obtained coating materials was coated to a water-polished tin plate at a thickness of 20 $\mu$m. This was dried for 10 minutes with a 75° C. warm blower. The coating was then hardened under a 80 W high pressure mercury lamp by irradiating for 30 seconds from a height of 15 cm. The results of evaluations of the characteristics of the obtained coatings are shown in Tables 2 and 4. The following tests were carried out to evaluate the capabilities of the resin with standards of measurement as noted.

(Dilutability in Water)

10 g of the formulated coating was mixed into 10 g of water, and a visual appraisal was made of appearance.

O: completely dissolved

X: no dissolving, with separation of resin and water (Washability in Water)

After drying a tin plate coated with the coating material for 20 minutes under a 75° C. warm blower, the plate was immersed in ion exchange water for 5 minutes, and a visual appraisal was made of the state of solubility of the coating.

O: no coating remained on the tin surface

Δ: slight amount of coating remained on the tin surface

X: coating remained on the tin surface (Light Hardening Ability)

After drying a coating material formed on a tin plate for 20 minutes under a 75° C. warm blower, the coating on the tin plate was hardened by irradiating at 100 mJ/cm² with a high pressure mercury lamp. An infrared photometer was employed to obtain the rate of reaction between the double bonds from the decrease in the absorption wavelength of the polymerizable unsaturated double bonds at 810 cm⁻¹.

(Thermal Hardening Ability)

After coating and drying a coating material coated to a tin plate for 20 minutes under a 75° C. warm blower, the coating on the tin plate was hardened by placing under a 150° C. dryer for 30 minutes. A infrared photometer was employed to obtain the rate of reaction between double bonds from the decrease in the absorption wavelength of the polymerizable unsaturated double bonds at 810 cm⁻¹.

(Resistance to Water)

After coating and drying a coating material coated to a tin plate for 20 minutes under a 75° C. warm blower, the coating on the tin plate was hardened by irradiating at 300 mJ/cm² employing a high pressure mercury lamp. The hardened resin was immersed for 30 minutes, after which a visual appraisal was made of the condition of the resin.

O: no abnormalities in the resin surface

Δ: whitening present on resin surface

X: peelings present on resin surface (Resistance to Boiling)

After coating and drying a coating material coated to a tin plate for 20 minutes under a 75° C. warm blower, the coating on the tin plate was hardened by irradiating at 300 mJ/cm² employing a high pressure mercury lamp. The hardened resin was immersed in boiling water for 5 minutes, after which a visual appraisal was made of the condition of the resin.

O: no abnormalities in the resin surface

Δ: whitening present on resin surface

X: peelings present on resin surface (Resistance to Solvents)

After coating and drying a coating material coated to a tin plate for 20 minutes under a 75° C. warm blower, the coating on the tin plate was hardened by irradiating at 300 mJ/cm² employing a high pressure mercury lamp. The hardened resin was immersed for 30 minutes in ethyl acetate, after which a visual appraisal was made of the condition of the resin.

O: no abnormalities in the resin surface

X: abnormalities present on resin surface (Application Examples 27~52)

Each of the resins obtained in Examples 1 through 26 was combined in an amount of 100 parts with 3 parts of 1-hydroxyhexylphenylketone, and stirred to mix sufficiently, thereby obtaining the coating material.

Next, each of the obtained coating materials were coated to a water-polished tin plate at a thickness of 20 μm. This was dried for 10 minutes with a 75° C. warm blower. The coating was then hardened with an 80 W high pressure mercury lamp by irradiating for 30 seconds from a height of 15 cm. The obtained resin was further hardened for 30 minutes at 150° C. The results of appraisals of the capacities of the obtained coating are shown in Tables 5 and 6.

(Comparative Application Examples 8~14)

Each of the resins obtained in Comparative Examples 1 through 7 was combined in an amount of 100 parts with 3 parts of 1-hydroxyhexylphenylketone, and stirred to mix sufficiently, thereby obtaining the coating material.

Next, each of the obtained coating materials were coated to a water-polished tin plate at a thickness of 20 μm. This was dried for 10 minutes with a 70° C. warm blower. The coating was then hardened with an 80 W high pressure mercury lamp by irradiating for 30 seconds from a height of 15 cm. The obtained resin was further hardened at 150° C. for 30 minutes. The results of appraisals of the capacities of the obtained coating are shown in Table 6. The tests to evaluate the capacity of the resin were carried out according to the measurement standards as noted.

(Resistance to Boiling)

The resins obtained in Application Example 2 and Comparative Application Example 2 were immersed in boiling water for 5 minutes, after which a visual appraisal of the condition of the resin was made.

O: no abnormality in resin surface

Δ: whitening present in resin surface

X: peelings present in resin surface (Resistance to Acids)

The resins obtained in Application Example 2 and Comparative Application Example 2 were immersed for 10 minutes in 10% by weight hydrochloracid solution, after which a visual appraisal was made of the coating. O: no abnormality in resin surface Δ: whitening present in resin surface X: peelings present in resin surface

TABLE 1

| APPLICATION EXAMPLE | RESIN | DILUT-ABILITY IN WATER | WASH-ABILITY IN WATER | PHOTO BARDEN-ABILITY |
|---|---|---|---|---|
| APPLICATION EXAMPLE 1 | A-1 | O | O | 59% |
| APPLICATION EXAMPLE 2 | A-2 | O | O | 58% |
| APPLICATION EXAMPLE 3 | B-1 | O | O | 57% |
| APPLICATION EXAMPLE 4 | B-2 | O | O | 56% |
| APPLICATION EXAMPLE 5 | C-1 | O | O | 55% |
| APPLICATION EXAMPLE 6 | C-2 | O | O | 59% |
| APPLICATION EXAMPLE 7 | D-1 | O | O | 62% |
| APPLICATION EXAMPLE 8 | D-2 | O | O | 56% |
| APPLICATION EXAMPLE 9 | E-1 | O | O | 55% |
| APPLICATION EXAMPLE 10 | E-2 | O | O | 60% |
| APPLICATION EXAMPLE 11 | F-1 | O | O | 59% |
| APPLICATION EXAMPLE 12 | F-2 | O | O | 55% |
| APPLICATION EXAMPLE 13 | G-1 | O | O | 55% |
| APPLICATION EXAMPLE 14 | G-2 | O | O | 61% |
| APPLICATION EXAMPLE 15 | H-1 | O | O | 57% |
| APPLICATION EXAMPLE 16 | H-2 | O | O | 59% |
| APPLICATION EXAMPLE 17 | I-1 | O | O | 61% |
| APPLICATION EXAMPLE 18 | I-2 | O | O | 65% |
| APPLICATION EXAMPLE 19 | J-1 | O | O | 64% |
| APPLICATION EXAMPLE 20 | J-2 | O | O | 63% |
| APPLICATION EXAMPLE 21 | K-1 | O | O | 60% |

TABLE 1-continued

| APPLICATION EXAMPLE | RESIN | DILUT-ABILITY IN WATER | WASH-ABILITY IN WATER | PHOTO BARDEN-ABILITY |
|---|---|---|---|---|
| APPLICATION EXAMPLE 22 | K-2 | ○ | ○ | 57% |
| APPLICATION EXAMPLE 23 | L-1 | ○ | ○ | 66% |
| APPLICATION EXAMPLE 24 | L-2 | ○ | ○ | 57% |
| APPLICATION EXAMPLE 25 | M-1 | ○ | ○ | 58% |
| APPLICATION EXAMPLE 26 | M-2 | ○ | ○ | 60% |

TABLE 2

| APPLICATION EXAMPLE | RESIN | DILUT-ABILITY IN WATER | WASH-ABILITY IN WATER | PHOTO BARDEN-ABILITY |
|---|---|---|---|---|
| COMPARATIVE EXAMPLE 1 | N-1 | X | X | 23% |
| COMPARATIVE EXAMPLE 2 | N-2 | ○ | Δ | 21% |
| COMPARATIVE EXAMPLE 3 | N-3 | ○ | Δ | 29% |
| COMPARATIVE EXAMPLE 4 | A-3 | ○ | ○ | 49% |
| COMPARATIVE EXAMPLE 5 | C-3 | ○ | ○ | 50% |
| COMPARATIVE EXAMPLE 6 | O-1 | X | X | 49% |
| COMPARATIVE EXAMPLE 7 | O-2 | ○ | X | 47% |

TABLE 3

| APPLICATION EXAMPLE | RESIN | THERMAL BARDENING ABILITY | RESISTANCE TO WATER | RESISTANCE TO BOILING | RESISTANCE TO SOLVENT |
|---|---|---|---|---|---|
| APPLICATION EXAMPLE 1 | A-1 | 78% | ○ | ○ | ○ |
| APPLICATION EXAMPLE 2 | A-2 | 71% | ○ | ○ | ○ |
| APPLICATION EXAMPLE 3 | B-1 | 77% | ○ | Δ | ○ |
| APPLICATION EXAMPLE 4 | B-2 | 74% | ○ | ○ | ○ |
| APPLICATION EXAMPLE 5 | C-1 | 69% | ○ | ○ | ○ |
| APPLICATION EXAMPLE 6 | C-2 | 71% | ○ | ○ | ○ |
| APPLICATION EXAMPLE 7 | D-1 | 72% | ○ | ○ | ○ |
| APPLICATION EXAMPLE 8 | D-2 | 78% | ○ | ○ | ○ |
| APPLICATION EXAMPLE 9 | E-1 | 62% | ○ | Δ | ○ |
| APPLICATION EXAMPLE 10 | E-2 | 68% | ○ | ○ | ○ |
| APPLICATION EXAMPLE 11 | F-1 | 70% | ○ | ○ | ○ |
| APPLICATION EXAMPLE 12 | F-2 | 66% | ○ | ○ | ○ |
| APPLICATION EXAMPLE 13 | G-1 | 71% | ○ | ○ | ○ |
| APPLICATION EXAMPLE 14 | G-2 | 76% | ○ | ○ | ○ |
| APPLICATION EXAMPLE 15 | H-1 | 69% | ○ | ○ | ○ |
| APPLICATION EXAMPLE 16 | H-2 | 65% | ○ | Δ | ○ |
| APPLICATION EXAMPLE 17 | I-1 | 70% | ○ | ○ | ○ |
| APPLICATION EXAMPLE 18 | I-2 | 69% | ○ | ○ | ○ |
| APPLICATION EXAMPLE 19 | J-1 | 79% | ○ | ○ | ○ |
| APPLICATION EXAMPLE 20 | J-2 | 74% | ○ | ○ | ○ |
| APPLICATION EXAMPLE 21 | K-1 | 73% | ○ | Δ | ○ |
| APPLICATION EXAMPLE 22 | K-2 | 70% | ○ | Δ | ○ |
| APPLICATION EXAMPLE 23 | L-1 | 75% | ○ | ○ | ○ |

TABLE 3-continued

| APPLICATION EXAMPLE | RESIN | THERMAL BARDENING ABILITY | RESISTANCE TO WATER | RESISTANCE TO BOILING | RESISTANCE TO SOLVENT |
|---|---|---|---|---|---|
| APPLICATION EXAMPLE 24 | L-2 | 69% | ◯ | ◯ | ◯ |
| APPLICATION EXAMPLE 25 | M-1 | 68% | ◯ | ◯ | ◯ |
| APPLICATION EXAMPLE 26 | M-2 | 72% | ◯ | ◯ | ◯ |

TABLE 4

| APPLICATION EXAMPLE | RESIN | THERMAL BARDENING ABILITY | RESISTANCE TO WATER | RESISTANCE TO BOILING | RESISTANCE TO SOLVENT |
|---|---|---|---|---|---|
| COMPARATIVE EXAMPLE 1 | N-1 | 52% | ◯ | ◯ | X |
| COMPARATIVE EXAMPLE 2 | N-2 | 50% | ◯ | ◯ | X |
| COMPARATIVE EXAMPLE 3 | N-3 | 59% | ◯ | Δ | ◯ |
| COMPARATIVE EXAMPLE 4 | A-3 | 65% | ◯ | X | ◯ |
| COMPARATIVE EXAMPLE 5 | C-3 | 66% | ◯ | X | ◯ |
| COMPARATIVE EXAMPLE 6 | O-1 | 59% | ◯ | ◯ | X |
| COMPARATIVE EXAMPLE 7 | O-2 | 49% | Δ | Δ | ◯ |

TABLE 5

| APPLICATION EXAMPLE | RESIN | RESISTANCE TO BOILING | RESISTANCE TO SOLVENT |
|---|---|---|---|
| APPLICATION EXAMPLE 27 | A-1 | ◯ | ◯ |
| APPLICATION EXAMPLE 28 | A-2 | ◯ | ◯ |
| APPLICATION EXAMPLE 29 | B-1 | ◯ | Δ |
| APPLICATION EXAMPLE 30 | B-2 | ◯ | ◯ |
| APPLICATION EXAMPLE 31 | C-1 | ◯ | ◯ |
| APPLICATION EXAMPLE 32 | C-2 | ◯ | ◯ |
| APPLICATION EXAMPLE 33 | D-1 | ◯ | ◯ |
| APPLICATION EXAMPLE 34 | D-2 | ◯ | ◯ |
| APPLICATION EXAMPLE 35 | E-1 | ◯ | Δ |
| APPLICATION EXAMPLE 36 | E-2 | ◯ | ◯ |
| APPLICATION EXAMPLE 37 | F-1 | ◯ | ◯ |
| APPLICATION EXAMPLE 38 | F-2 | ◯ | ◯ |
| APPLICATION EXAMPLE 39 | G-1 | ◯ | ◯ |
| APPLICATION EXAMPLE 40 | G-2 | ◯ | ◯ |
| APPLICATION EXAMPLE 41 | H-1 | ◯ | ◯ |
| APPLICATION EXAMPLE 42 | H-2 | ◯ | Δ |
| APPLICATION EXAMPLE 43 | I-1 | ◯ | ◯ |
| APPLICATION EXAMPLE 44 | I-2 | ◯ | ◯ |
| APPLICATION EXAMPLE 45 | J-1 | ◯ | ◯ |
| APPLICATION EXAMPLE 46 | J-2 | ◯ | ◯ |
| APPLICATION EXAMPLE 47 | K-1 | ◯ | Δ |
| APPLICATION EXAMPLE 48 | K-2 | ◯ | Δ |
| APPLICATION EXAMPLE 49 | L-1 | ◯ | ◯ |
| APPLICATION EXAMPLE 50 | L-2 | ◯ | ◯ |
| APPLICATION EXAMPLE 51 | M-1 | ◯ | ◯ |
| APPLICATION EXAMPLE 52 | M-2 | ◯ | ◯ |

TABLE 6

| APPLICATION EXAMPLE | RESIN | RESISTANCE TO BOILING | RESISTANCE TO SOLVENT |
|---|---|---|---|
| COMPARATIVE EXAMPLE 8 | N-1 | ◯ | X |
| COMPARATIVE EXAMPLE 9 | N-2 | ◯ | X |

TABLE 6-continued

| APPLICATION EXAMPLE | RESIN | RESISTANCE TO BOILING | RESISTANCE TO SOLVENT |
|---|---|---|---|
| COMPARATIVE EXAMPLE 10 | N-3 | X | X |
| COMPARATIVE EXAMPLE 11 | A-3 | X | X |
| COMPARATIVE EXAMPLE 12 | C-3 | X | X |
| COMPARATIVE EXAMPLE 13 | O-1 | ○ | Δ |
| COMPARATIVE EXAMPLE 14 | O-2 | ○ | Δ |

As is clear from the results shown in Tables 1 through 6, the radiation curable resin composition of the present invention can be freely hardened at room temperature or under heating conditions. Moreover, it may be diluted with either water or an organic solvent, and can be redissolved with water or diluted oxyhydrogen solution prior to hardening. Following hardening, this resin composition forms a coating which has excellent adherence to a substrate, as well as superior resistance to heat, chemicals and boiling. Further, this resin composition has wide applications as an ink, coating and the like.

The present invention provides a radiation curable resin composition and method of production therefor. This composition has wide applications as an ink, coating or the like, is dilutable in water or an organic solvent, and forms a coating which has excellent hardening characteristics and adherence to a substrate, as well as superior resistance to heat, chemicals and boiling. Further, this resin composition may be redissolved with water or an organic solvent prior to hardening.

What is claimed:

1. A radiation curable resin composition containing a copolymer having a number average molecular weight of 500 to 5,000, wherein an aprotic ammonium salt is contained in the copolymer of the resin in the amount of 0.1 to 4.0 mol/kg.; said aprotic ammonium salt represented by the chemical formula:

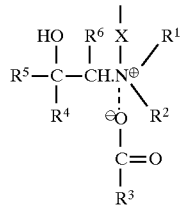

wherein, X is an organic group which is bound to the main chain and includes a hydrocarbon containing up to 3 carbon atoms, an ester or an amide; R1 and R2, which may be the same or different, represent a hydrocarbon of 1 to 8 carbons, and said hydrocarbon may be substituted with a hydroxyl group, ester group, alkoxy group, or a halogen atom; where R1 and R2 may bond together, with bonding occurring between the nitrogen atom and R1 and R2 to form a heterocyclic ring; R3 indicates a hydrocarbon of 1 to 18 carbon atoms having one or more polymerizable unsaturated double bonds and may be substituted with a hydroxyl group, ester group, alkoxy group, or halogen atom; and R4, R5 and R6, which may be the same or different, represent a hydrogen atom or a hydrocarbon of 1 to 18 carbons that has one or more polymerizable unsaturated double bonds and may be substituted with a hydroxyl group, ester group, alkoxy group, or halogen atom, and wherein R5 and R6 may bond together to form a ring.

2. A radiation curable resin composition according to claim 1 obtained by using a monocarboxylic acid (B) to convert an amino group in a copolymer (A) into a quaternary ammonium salt group, and reacting the quaternary ammonium salt group with an epoxy compound (C), wherein aprotic ammonium salt groups represented by chemical formula:

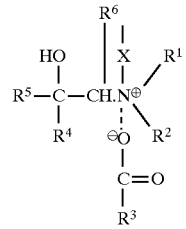

are contained in the resin in the amount of 0.1 and 4.0 mol/kg.

3. A radiation curable resin composition according to claim 2 wherein the copolymer (A) having an amino group is a polymer of compound (D) having polymerizable unsaturated double bonds and a tertiary amino group, or is a copolymer of a compound (D) and a compound (E) having polymerizable unsaturated double bonds that are copolymerizable with said compound (D).

4. A radiation curable resin composition according to one of claims 2 and 3 wherein the copolymer (A) having an amino group is a copolymer of compound (D), which has polymerizable unsaturated double bonds and a tertiary amino group, and a compound (F) which has an alcoholic hydroxyl group and polymerizable unsaturated double bonds that are copolymerized with compound (D); and/or said copolymer (A) is a copolymer of compound (D), compound (F) and a compound (E), which has polymerizable unsaturated double bonds that can be copolymerized with compounds (D) and (F).

5. A radiation curable resin composition according to one of claims 2 and 3 wherein an epoxy compound (C) is a monoepoxy compound having one or more polymerizable unsaturated double bonds.

6. A radiation curable resin composition according to one of claims 2 and 3 wherein the epoxy compound (C) is glycidyl(meth)acrylate and α-methylglycidyl(meth) acrylate.

7. A radiation curable resin composition according to any one of claims 1 to 3 wherein the composition includes a photoinitiator.

8. A method for production of a radiation curable resin composition including the aprotic ammonium salt group shown by chemical formula:

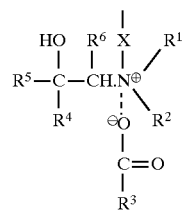

in the amount of 0.1 to 4.0 mol/kg, the method comprising the steps of:

forming a quaternary ammonium group by reacting monocarboxylic acid (B) having at least one polymerizable unsaturated double bond with a copolymer (A) which is prepared by copolymerizing a compound (D) having unsaturated double bonds and a tertiary amino group and a compound (E) having polymerizable unsaturated double bonds that are copolymerizable with said compound (D); and reacting a monoepoxy compound (C) with said quaternary ammonium group;

wherein, X is an organic group which is bound to the main chain and includes a hydrocarbon containing up to 3 carbon atoms, an ester, or an amide;

R1 and R2 which may be the same or different, represent a hydrocarbon of 1 to 8 carbon atoms and said hydrocarbon may be substituted with a hydroxyl group, ester group, alkoxy group, or a halogen atom, where R1 and R2 may bond together, with bonding occurring between the nitrogen atom and R1 and R2 to form a heterocyclic ring;

R3 indicates a hydrocarbon of 1 to 18 carbon atoms having one or more polymerizable unsaturated double bonds and may be substituted with a hydroxyl group, ester group, alkoxy group, or halogen atom; and R4, R5 and R6, which may be the same or different, represent a hydrogen atom or a hydrocarbon of 1 to 18 carbon atoms [and a hydrogen atom of R4, R5 and R6] which may be substituted with a hydroxyl group, ester group, alkoxy group, or halogen atoms, wherein R5 and R6 may bond together to form a ring.

9. A method for production of a radiation curable resin composition including the aprotic ammonium salt group shown by chemical formula:

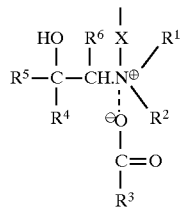

in the amount of 0.1 and 4.0 mol/kg and an ether group generated by a reaction between an alcoholic hydroxyl group and a glycidyl group, the method comprising the steps of:

forming a quaternary ammonium group by reacting a monocarboxylic acid (B) with at least one polymerizable unsaturated double bond with a copolymer (A) which has an amino group, copolymer (A) being a copolymer of a compound (D), which has polymerizable unsaturated double bonds and a tertiary amino group, and a compound (F), which has an alcoholic hydroxyl group and polymerizable double bonds which are copolymerizable with compound (D), and/or being a copolymer of compound (D), compound (F) and a compound (E) which has polymerizable unsaturated double bonds that are copolymerizable with compound (D) and compound (F); and reacting a monoepoxy compound with said quaternary ammonium group and the alcoholic hydroxyl group;

wherein, X is an organic group which is bound to the main chain; and includes a hydrocarbon of 1 to 3 carbon atoms, an ester, or an amide;

R1 and R2 which may be the same or different, represent a hydrocarbon of 1 to 8 carbon atoms and said hydrocarbon may be substituted with a hydroxyl group, ester group, alkoxy group, or a halogen atom, wherein R1 and R2 may bond together, with bonding occurring between the nitrogen atom and R1 and R2 to form a heterocyclic ring;

R3 indicates a hydrocarbon of 1 to 18 carbon atoms that has one or more polymerizable unsaturated double bonds and may be substituted with a hydroxyl group, ester group, alkoxy group or halogen atom; and R4, R5 and R6, which may be the same or different, represent a hydrogen atom or a hydrocarbon of 1 to 18 carbon atoms, which may be substituted with a hydroxyl group, ester group, alkoxy group or halogen atoms, wherein R5 and R6 may bond together to form a ring.

* * * * *